United States Patent [19]

Mahulikar et al.

[11] Patent Number: 5,023,398
[45] Date of Patent: Jun. 11, 1991

[54] ALUMINUM ALLOY SEMICONDUCTOR PACKAGES

[75] Inventors: Deepak Mahulikar, Meriden; James M. Popplewell, Guilford, both of Conn.

[73] Assignee: Olin Corporation, New Haven, Conn.

[21] Appl. No.: 504,741

[22] Filed: Apr. 4, 1990

Related U.S. Application Data

[63] Continuation-in-part of Ser. No. 253,639, Oct. 5, 1988, Pat. No. 4,939,316.

[51] Int. Cl.$^5$ .............................................. H01L 23/02
[52] U.S. Cl. ...................................... 174/52.4; 501/1; 501/11; 357/74
[58] Field of Search .................. 174/52.4, 52.3, 52.2, 174/52.1; 357/74, 70, 72, 75, 80; 501/11, 1

[56] References Cited

U.S. PATENT DOCUMENTS

| | | |
|---|---|---|
| 3,871,018 | 3/1975 | Jackson et al. . |
| 4,105,861 | 8/1978 | Hascoe . |
| 4,202,700 | 5/1980 | Wilder . |
| 4,410,927 | 10/1983 | Butt . |
| 4,461,924 | 7/1984 | Butt . |
| 4,480,262 | 10/1984 | Butt . |
| 4,498,121 | 2/1985 | Breedis et al. . |
| 4,521,469 | 6/1985 | Butt et al. . |
| 4,524,238 | 6/1985 | Butt . |
| 4,525,422 | 6/1985 | Butt et al. . |
| 4,542,259 | 9/1985 | Butt . |
| 4,582,556 | 4/1986 | Butt et al. . |
| 4,594,770 | 6/1986 | Butt . |
| 4,656,499 | 4/1987 | Butt . |
| 4,707,724 | 11/1987 | Suzuki et al. . |
| 4,711,826 | 12/1987 | Shapiro et al. ............... 428/630 |
| 4,769,345 | 9/1988 | Butt et al. . |
| 4,775,647 | 10/1988 | Smith . |

FOREIGN PATENT DOCUMENTS 817636 8/1959 United Kingdom .

Primary Examiner—Leo P. Picard
Assistant Examiner—Bot L. Ledynh
Attorney, Agent, or Firm—Gregory S. Rosenblatt; Paul Weinstein

[57] ABSTRACT

The present invention relates to a package adapted to house an electronic device, such as a semiconductor integrated circuit. The package components are comprised of aluminum based alloy. At least a portion of the surfaces of the package components are anodized to enhance corrosion resistance and increase bond strength. The aluminum based packages are characterized by lighter weight than copper based packages and better thermal conductivity than plastic based packages.

13 Claims, 1 Drawing Sheet

ALUMINUM ALLOY SEMICONDUCTOR PACKAGES

This application is a continuation-in-part of application Ser. No. 07/253,639, filed Oct. 5, 1988, now U.S. Pat. No. 4,939,316.

This invention relates to semiconductor packages in general and, more particularly, to light weight non-hermetic packages having improved corrosion resistance.

In the electronics industry, the rapid development and extensive use of integrated circuits, such as silicon based semiconductor devices have resulted in a proliferation of package designs to house electronic devices. The packages may be broadly categorized as either hermetic or non-hermetic.

Hermetic packages are generally formed from ceramic or metal components and are usually glass sealed. An example of a hermetic package is the CERDIP, ceramic dual-in-line package.

Non-hermetic packages are generally formed from ceramic, metal or plastic components and are usually epoxy sealed. Non-hermetic packages are also formed by molding a plastic body about the electronic device.

Metal non-hermetic packages comprise metal base and cover components with or without a window frame. A leadframe is disposed either between the base component and the cover component or between the base component and the window frame. The package components are bonded together with a polymer adhesive such as epoxy.

Epoxy sealed non-hermetic packages are disclosed in U.S. Pat. No. 4,105,861 issued to Hascoe and U.S. Pat. No. 4,594,770 issued to Butt. Copper or a copper alloy is preferred in U.S. Pat. No. 4,594,770 due to the high thermal conductivity of the metal.

It is desirable to maximize the strength of the epoxy to metal bond. One method of improving the adhesive to metal bond is to coat the metal components with a second material which forms a stronger bond to the metal substrate. The second material may be deposited by cladding, plating, sputtering, vapor deposition or any other technique known in the art. The bond may be further strengthened by a post deposition treatment such as oxidation or passivation. Coating of a copper based leadframe to improve resin adhesion is disclosed in U.S. Pat. No. 4,707,724 issued to Suzuki et al.

A molded plastic package has insufficient thermal conductivity for high power circuits which generate a large quantity of heat during operation. Copper base and cover components may add too much weight for applications such as aerospace.

An aluminum based metal package would have a significant advantage over copper based metal packages. The weight of the assembled package is up to about 60% less than that of the comparable copper package. Weight is important in aerospace, military and outer space applications where a large number of electronic devices are utilized and a significant weight penalty exists.

Until now, aluminum and aluminum alloys have not been satisfactory for electronic packages due to the tendency of the metal to corrode. The assembled packages fail a salt spray corrosion test specified in Military-Standard-883.

The salt corrosion test comprises an aqueous solution containing 3% by weight sodium chloride. The solution is held at 35° C. and the packages are immersed for 24 hours. Upon removal, the packages made from an aluminum based alloy exhibit numerous small corrosion pits. By comparison, a package made using copper alloy 197 having a nominal composition of 0.5% Fe, 0.035% Mg, 0.18% P and the balance copper exhibits no corrosion pitting after the same 24 hour salt corrosion test.

It is an object of the present invention to manufacture an electronic package from aluminum or aluminum based alloy components.

It is an advantage of the present invention that the aluminum or aluminum based alloy components have improved corrosion resistance.

It is a feature of the invention that the improved corrosion resistance is imparted by anodizing at least a portion of the aluminum or aluminum based alloy components prior to bonding.

It is an advantage of the invention that aluminum or aluminum based alloy package components weigh up to about 60% less than comparable copper or copper alloy components.

It is an advantage of the invention that the aluminum or aluminum based alloy components are less costly than comparable copper or copper alloy based components.

It is an advantage of the invention that the electronic device may be electrically isolated from the package components while high thermal conductivity is maintained.

In accordance with the invention, the foregoing objects, features and advantages are obtained by a package to encase an electronic device. The package comprises aluminum or aluminum alloy base and cover components. A leadframe is disposed between the base and cover components and adapted to be bonded to both. An anodization layer covers at least that portion of the base and cover components exposed to the atmosphere. The package may be resin sealed. An improved seal is obtained by anodizing the seal areas of the base and cover components.

Accordingly, a light weight non-hermetic package comprising aluminum or aluminum based alloy components is claimed. Improved corrosion resistance is obtained by an anodization surface applied to at least a portion of the surfaces of the package components.

It is known to form a refractory oxide such as aluminum oxide on the sealing surface of the alloy to enhance bonding. For example, U.S. Pat. No. 4,542,259 issued to Butt discloses forming a refractory aluminum oxide coating on copper alloy CDA 63800 to enhance glass sealability. Copper alloy 63800 is a copper based alloy containing from about 2% to about 12% aluminum.

An anodized aluminum surface differs compositionally from a refractory aluminum oxide surface. The refractory oxide is anhydrous, or water free. The anodized surface comprises hydrated aluminum oxide. The water concentration varies from a trace up to about equal molar concentration with the aluminum oxide ($Al_2O_3 \cdot H_2O$). The anodization is deposited by an electrochemical process rather than high temperature oxidation as usually used to form refractory oxide layers.

Unlike chemical deposition techniques such as plating, sputtering or vapor deposition, anodization is a chemical conversion process. A chemical conversion process forms a surface coating consisting of a compound of the base metal.

A better understanding of the essential features of the invention will be obtained from the following specification and accompanying drawings.

Figure 1:
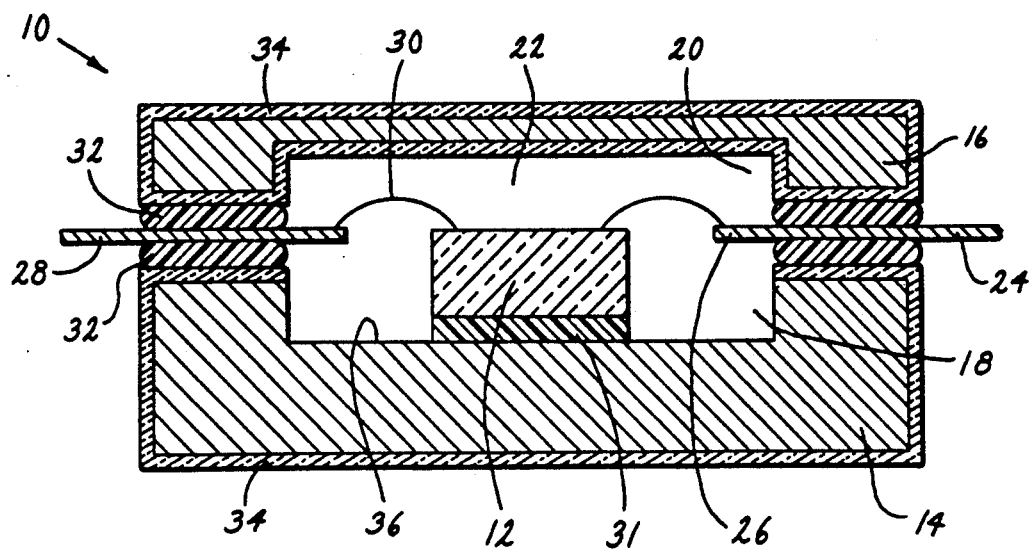
FIG. 1 illustrates an electronic package manufactured according to the invention.

FIG. 1 illustrates an electronic package 10 adapted to house an electronic device 12. The electronic device 12 is typically an integrated circuit such as a silicon based semiconductor device. The package 10 is comprised of a base component 14 and a cover component 16. A depression 18 is optionally formed in the base component 14. A second depression 20 is optionally formed in the cover component 16. These depressions serve to form a cavity 22 to encase the electronic device 12. The depressions are usually formed by milling or chemical etching. Alternatively, a metal deformation process may be used to form the cavities.

The base component 14 and the cover component 16 are preferably manufactured from aluminum or an aluminum alloy. Aluminum alloys designated by the ASM (American Society for Metals) as 3xxx series are preferred. These alloys contain up to about 1.5% by weight manganese along with other alloying elements. The alloys have good thermal conductivity and about 20% higher strength than the alloys designated as the 1xxx series (greater than 99.00% aluminum). A most preferred aluminum alloy is aluminum alloy 3003 having a nominal composition of about 0.12% by weight copper, about 1.2% by weight manganese and the balance aluminum.

A leadframe 24 is disposed between the base component 14 and the cover component 16. The leadframe 24 comprises inner lead ends 26 and outer lead ends 28. Inner lead ends 26 are adapted for electrical interconnection to the electronic device 12 as by wire bonds 30. The outer lead ends 28 are adapted for connection to an external device such as a printed circuit board.

The electronic device 12 is bonded to the base component 14 by a die attach 31. The die attach 31 may be electrically conductive or electrically insulating dependent upon the needs of the electronic device 12. As the coefficient of thermal expansion of the aluminum or aluminum alloy base component 14 is from about $230 \times 10^{-7}$ in/in/°C. to about $274 \times 10^{-7}$ in/in/°C. and the coefficient of thermal expansion of the electronic device is about $49 \times 10^{-7}$ in/in/°C., it is preferred to use a compliant die attach system. A compliant die attach system will absorb the stresses created by the coefficient of thermal expansion mismatch generated during die attach, package sealing and device operation. Silver filled polyimide die attach systems are particularly well suited for the package as are die attach systems incorporating a relatively low coefficient of thermal expansion buffer.

Sealing the leadframe 24 to the base component 14 and the cover component 16 are bonding layers 32. The bonding layers may be any adhesive known in the art and are commonly a polymer adhesive or a sealing glass.

While the invention is applicable to both glass sealed and polymer sealed packages, it is more particularly drawn to polymer sealed packages and will be described in that context.

The adhesive layers 32 may be comprised of any suitable thermosetting or thermoplastic resin. A resin adhesive such as an epoxy, for example, Ablestik 550K manufactured by Ablestik Laboratories of Gardena, Calif. is one exemplary bonding material. This sealant is bonded at a temperature in the range of from about 145° C. to about 155° C. Bonding times range from about 1 hour to about 2 hours.

It has been discovered that an anodization layer 34 on at least a portion of the base 14 and cover 16 components yields superior results. Both a thin anodization layer, defined as having a thickness of less than about 100 microinches and a thick anodization layer produce aluminum base electronic packages which exhibited no corrosion when subjected to the 24 hour salt corrosion test. The preferred thickness of the anodization layer is from about 10 microinches to about 2000 microinches. The most preferred thickness is in the range of from about 50 microinches to about 200 microinches.

The anodization layer may be applied by any technique known in the art. For example, an aqueous solution containing about 20 volume percent sulfuric acid at a temperature of about 20° C. deposits a satisfactory anodized layer on the surface of an anodically charged aluminum or aluminum alloy substrate. The anodization layer is applied either before or after the formation of depressions 18, 20 in the base 14 and cover 16 components. The surface 36 of the depression may either be anodized or bare metal.

A sealing process is preferably used to reduce porosity. A typical anodization sealing process is water or steam sealing. The process entails exposing the anodized surface to pressurized steam for from about 30 minutes to about 60 minutes. The anodized surface hydrates to form crystalline boehmite ($Al_2O_3 \cdot H_2O$). The conversion to boehmite results in a volume increase effectively closing any pores in the anodized surface. Other satisfactory sealing solutions include nickel acetate, ferric oxalate, dichromates and molybdates.

A slight thermal conductivity advantage is achieved with bare metal, without an anodization layer. The bare metal is electrically conductive. For certain electronic applications, such as housing a bipolar device, a conductive substrate is not desirable. These devices are preferable electrically isolated from the package and the use of a thermally and electrically conductive die attach such as silver filled epoxy on bare metal results in shorting. The present invention overcomes this problem by disposing a dielectric layer of anodization between the conductive die attach and the base metal electrically isolating the device from the package.

Even though the thermal conductivity of aluminum alloy 3003 is only about 50% that of copper alloy 197, the $\theta_{JC}$ values are about equal and the $\theta_{JA}$ value only in the range of about from 10% to about 15% higher. It is believed the reason for this is that the largest contributor to $\theta_{JC}$ and $\theta_{JA}$ values is the die attach material. The thermal resistance of the aluminum substrates is a minor contributor to the $\theta$ values.

As discussed hereinabove, an advantage of metal packages over ceramic or plastic packages is thermal performance. Thermal performance is typically recorded as $\theta_{JC}$ and $\theta_{JC}$ is a measure of the temperature difference between the junction and the case. The junction temperature is measured at the die attach 31 and the case temperature is measured at a point along the package base 14. Similarly, $\theta_{JA}$ is a measure of the temperature difference between the junction and the ambient environment. Table 1 gives measured values for a 48 pin dual in line epoxy sealed package having either copper alloy 197 or aluminum alloy 3003 components.

TABLE 1

| Component Composition | $\theta_{JC}$ °C./W | $\theta_{JA}$ still air °C./W | $\theta_{JA}$ forced air °C./W |
|---|---|---|---|
| Cu alloy 197 | 2-3 | 18.5-22 | 5-6 |
| Al alloy 3003 | 2-3 | 17-19 | 8 |

Copper has a density about three times that of aluminum. A package weighing about 60% less than a conventional copper metal package may be obtained with only a minimal loss in thermal performance in accordance with this invention.

The invention is not limited to dual in line packages. QUAD packages having lead ends approaching the electronic device from all four sides of the device periphery may also be assembled using aluminum based components having anodized surfaces.

Figure 2:
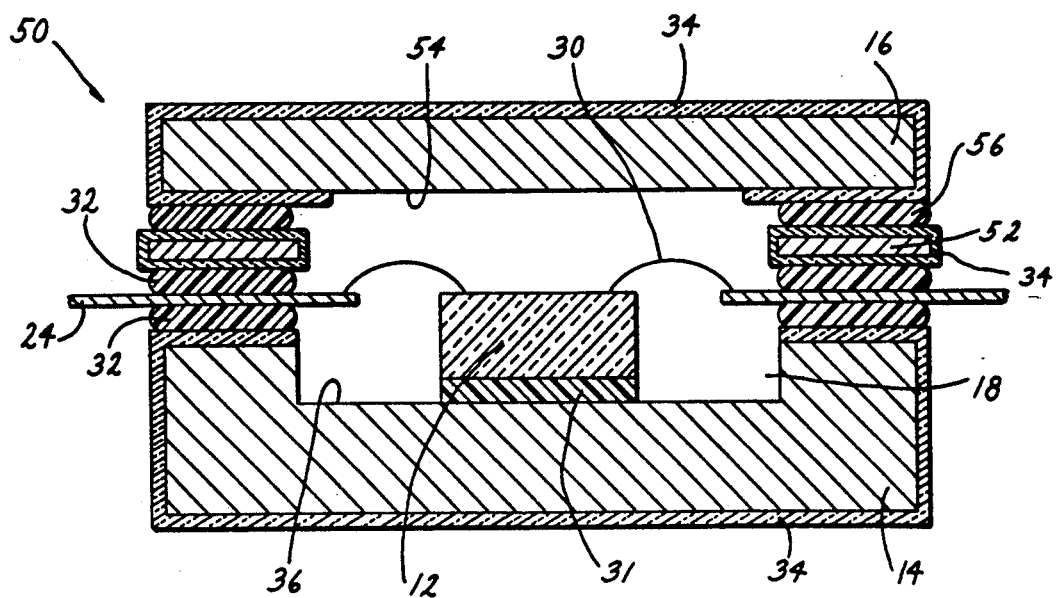
FIG. 2 illustrates a window frame type electronic package manufactured according to the invention.

Window frame packages as shown in FIG. 2 are also made according to the invention. window frame package 50 is similar to the above described package with the exception that a window frame 52 is disposed between the leadframe 24 and the cover component 16'. A window frame package is desirable in the situation where the electronic device 12 is to be die attached and wire bonded at a different time than the package is assembled as where a vendor manufacturers the package for shipment to a device maker.

The window frame 52 is comprised of any somewhat rigid material which is bondable to sealant 32. The window frame preferably has a coefficient of thermal expansion close to that of the cover component 16' or the leadframe 24. Preferred window frame materials are copper, aluminum and the alloys of the metals. To minimize package weight, aluminum or aluminum alloys are most preferred. For improved strength, manganese containing aluminum alloys such as aluminum alloy 3003 are preferred.

In the window frame package, a leadframe 24 is disposed between the window frame 52 and a base component 14. For improved corrosion resistance, an anodization layer 34 is applied to the base component 14 and the window frame component 52. The leadframe 24 is bonded to a first side of the window frame 52 and to the base component 14 with a suitable bonding agent 32 such as a glass or a polymer adhesive. Subsequent to bonding the leadframe 24, the electronic device 12 is bonded as by a die attach 31 and electrically connected to the inner leads 26 of the leadframe 24 by wire bonds 30. A cover component 16 is then bonded to the second side of the window frame 52 with a sealant 56 to encase the electronic device 12.

The sealant 56 is selected to be any material known in the art which will bond to the window frame 52 and the cover component 16 at a relatively low temperature. The desired bonding temperature is low enough so as not to degrade the sealant 32 or the electronic device 12. The sealant preferably bonds at a temperature of less than about 150° C. The sealant may be any compatible thermosetting or thermoplastic adhesive. A preferred sealant is the epoxy Ablestik 550.

It is preferable to coat the cover component 16 with an anodization layer 34 for improved corrosion resistance. The anodization layer may be applied over all or a portion of the base component 14, the cover component 16 desirable or necessary to entirely coat every surface of the base and cover component.

The region of the surfaces coated varies. At a minimum, all surfaces exposed to the atmosphere should be coated to prevent corrosion. The seal areas, those surfaces in contact with the sealants 32 and 54 may be coated for improved bond strength. The remaining surface areas are optionally coated dependent upon desired electrical, thermal and moisture getting properties.

Interior surfaces 36 and 54 may preferably not be anodized. Better thermal conductivity is achieved by bonding the electronic device 12 directly to the aluminum or aluminum alloy surface 36. If the surface to be bonded 36 is not anodized, the electronic device electrically connected to the base component as for grounding. If the surface 36 is anodized, the electronic device may be electrically isolated from the package.

A moisture trapping surface, such as a getter alloy may be formed on the interior surface 54 of the cover component to trap residual moisture and sealing reaction by-products.

Surfaces free of anodization may be prepared by a variety of methods. The portion of the surface desired to be anodization free may be coated with a chemical resist or a plater's tape prior to immersion in the anodizing solution. The entire surface may be anodized and the desired region made anode free by a mechanical operation. For example, a depression 18.

By varying the anodization parameters, a roughened anodization layer may be formed. A rougher surface finish increased mechanical locking of the bonding component, particularly a polymer sealant, and improves the bond strength. It is apparent the invention provides an electronic package having improved characteristics. The package is more light weight than copper based packages and has better thermal conductivity than plastic based packages. Anodizing at least a portion of the aluminum surfaces provides for increased resistance to corrosion and further increases bond strength.

A pressure pot test was used to evaluate the strength of the adhesive bond to anodized aluminum alloy based packages. The packages were epoxy sealed and then subjected to 100% relative humidity at 121° C. and 14 psi. Leak testing revealed no adhesive failures after 200 hours.

By adjusting the chemical composition and operating parameters of the anodization and sealing solutions, different color surfaces may be obtained. This is beneficial in consumer electronic applications where a black or gold finish is often desirable.

As discussed above, the bonding layers may be any adhesive known in the art. Most preferably a polymer adhesive or a sealing glass is used. When a sealing glass is selected, the coefficient of thermal expansion of the aluminum package substrates must be considered. Aluminum has a very high coefficient of thermal expansion, on the order of $235 \times 10^{-7}$/°C. Aluminum also has a relative a low melting point, 660° C. The suitable sealing glass must have a coefficient of thermal expansion close to that of aluminum or the aluminum alloy. The coefficient of thermal expansion of the sealing glass should be within about 20% that of the aluminum substrate. Preferably, the coefficient of thermal expansion of the glass should be within about 10% that of the substrate. Also, the glass sealing temperature must be below the melting point of the glass.

One suitable glass as disclosed in U.S. Pat. No. 4,202,700 by Wilder, Jr has a coefficient of thermal expansion approximately matching that of aluminum and a sealing temperature of 350° C. to 400° C. The strength and chemical resistance of this glass may be improved by devitrication. The aluminum sealing glass has the composition about 40 molar percent $Na_2O$, 10% BaO, 1% $Al_2O_3$ and 49% $P_2O_5$.

Another class of glasses which are believed satisfactory are low temperature sealing glasses designed for copper or copper alloys. Such glasses are disclosed in U.S. Pat. No. 4,775,647 to Smith, III; U.S. Pat. No. 4,952,531 by Cherukuri and U.S. patent application Ser. No. 239,891 entitled "Glass/Ceramic Sealing System" by Cherukuri, filed Sept. 2, 1988. The Smith III patent and the patent applications are assigned to the assignee of the present application.

U.S. Pat. No. 4,775,647 discloses a glass composite having a first component consisting essentially of a glass matrix selected from the group consisting of lead borate, lead-zinc borate, lead borate silicate, and lead-zinc borate silicate glasses. The glass matrix is selected to have a coefficient of thermal expansion in excess of about $80 \times 10^{-7}$/°C. (from ambient to glass transition temperature.) Added to the glass matrix is a filler having a high coefficient of thermal expansion. The filler, either calcium fluoride or barium fluoride, is added to the glass matrix in an effective amount of up to about 30 weight percent.

U.S. Pat. No. 4,953,531 discloses a sealing glass having the composition of at least 50 molar percent $SiO_2$, about 12 to about 15% BaO, from about 20 to about 30% of an alkaline oxide component comprised of at least two alkaline oxides selected from the group consisting of $Na_2O$, $K_2O$ and $Li_2O$, from about 0.5 to about 5% $Al_2O_3$ and up to about 10% of an additive selected from the group consisting $B_2O_3$, $P_2O_5$, MgO, CaO, $GeO_2$, SrO, PbO and mixtures thereof. The melting temperature of this glass is disclosed to be over 700° C. The melting temperature may be lowered by selecting the additive to be a sufficient amount of lead oxide.

U.S. patent application Ser. No. 239,891 discloses a glass/ceramic sealing system having the composition of at least about 40 molar percent SiO, from about 5 to about 25% BaO, from about 15 to about 45% of an alkaline oxide component comprising at least two oxides selected from the group consisting $LiO_2$, $K_2O$, $Rb_2O_3$, and $Cs_2O_3$, from about 0.1 to about 5% of a nucleating agent, up to about 15% ZnO, up to about 10% PbO, up to about 5% $Al_2O_3$ and up to about 10% of an additive. The glass has a sealing temperature above about 750° C. Proper selection of the additives may lower the glass to a temperature suitable for sealing to an aluminum substrate.

Yet another glass is disclosed in British Patent Specification GB 817,636, published Aug. 6, 1959. This glass is disclosed to have a composition of 32% to 50% by weight $SiO_2$, 4 to 27% $Na_2O$, 4 to 27% $K_2O$, up to 5% $Li_2O$, 2 to 8% BaO, 2 to 8% SrO, 4 to 30% $TiO_2$, up to 7% ZnO, up to 2% $ZrO_2$ and up to 2% $Al_2O_3$. For sealing to aluminum, the silica concentration should be less than 45 percent.

The following example is intended to illustrate, but in no way to limit the scope of, the present invention.

PROPSED EXAMPLE 1

With reference to FIG. 2, an aluminum or aluminum alloy base component 14 and window frame component 52 are anodized to a thickness in the range of about 10 microinches to about 2000 microinches. While the anodization layer may be any suitable thickness within this range, it is believed that thicker anodization layers are preferred. When the anodization layer is in excess of about 1000 microinches, the expansion coefficient of the aluminum substrate may be slightly reduced.

A glass such as that disclosed in U.S. Pat. No. 4,202,700 is prepared by mixing powders in the appropriate proportions of the metal oxides or carbonates plus ammonium dihydrogen phosphate. The mixed powders are first calcinated at 300° C. to drive off water and ammonia and then fused at from 850° C. to 1000° C. A nucleating agent such as platinum may be added to the melt. The glass is cast into a slab and ground to powder.

The glass powder is mixed with an organic solvent such as terpineol to facilitate application to anodized aluminum substrates. Application of the glass/solvent mixture is frequently by screen Printing, although any Process known in the art is acceptable. The sealing glass 32 is glazed to both the package substrate 14 and the window frame component 52 by heating to a temperature sufficient to evaporate the binder and cause the glass particles to sinter and loosely bond to adjoining glass particles as well as to the anodized metal substrate.

The glazed base 14 and window frame 52 components are aligned with a lead frame 24 disposed between the two components. The leadframe is preferably formed from a precipitation hardenable alloy having a high coefficient of thermal expansion. Precipitation hardenable copper alloys such as C 724 (nominal compositional 84.3% copper, 13.0% nickel, 2.0% aluminum, 0.5% manganese and 0.2% magnesium) and copper alloy 7025 (nominal composition 96.2% copper, 3.0% nickel, 0.65% silicon and 0.15% magnesium) are preferred. A high conductivity copper alloy, such as C194 or C197 may be used. To improve the glass to metal bond, it is desirable to form a refractory oxide layer on the bonding surfaces of the copper alloy leadframe. The refractory oxide layer may be formed in situ or by depositing a refractory oxide forming metal or alloy on the leadframe surfaces.

The assembly is then fired in a furnace at a temperature sufficient to bond the glass to both the leadframe and the aluminum or aluminum alloy substrates. For the '700 glass, the sealing temperature is in the range of 350° C. to 400° C. with a dwell time of about two hours. If it is desired to devitrify the glass to produce a glass-ceramic having increased strength and chemical resistance, the glass is then heated to a temperature of 400° C. to 450° C. for about two hours for nucleation of the crystal phase and then to a temperature of about 450° C. to 525° C. for about two hours for growth of the crystal phase. The sealed assembly is cooled to room temperature. A satisfactory heating rate is 5° C. per minute, and a satisfactory cooling rate is 1° C. per minute.

An electronic device 12 is then bonded to the base component 14 by die attach 31. Due to the mismatch in coefficients of thermal expansion, a compliant die attach system is preferred. A cover component 16' is bonded to the second side of the window frame 52 with a sealant 56 to encase the electronic device. The sealant 56 should have a bonding temperature low enough that bonding will not thermally degrade the sealing glass 32, electronic device 12 or die attach 31. A low temperature sealing glass, solder or adhesive is preferred.

It is apparent that there has been provided in accordance with this invention a number of embodiments which are especially suited for electronic packages comprised of aluminum or aluminum alloy components which have improved resistance to corrosion. While the invention has been described in connection with the embodiments thereof, it is evident that may alternatives, modifications and variations will be apparent to those skilled in the art in light of the foregoing description. Accordingly, it is intended to embrace all such alternatives, modifications and variations as fall within the spirit and broad scope of the appended claims.

What is claimed is:

1. A package for encasing an electronic device, comprising:
   a base component formed from aluminum or an aluminum alloy;
   a window frame component formed from aluminum or an aluminum alloy and having first and second surfaces;
   said base component and said window frame component defining a cavity;
   a leadframe disposed between and adapted to be bonded to said base component and to the first surface of said window frame component, said leadframe bonded to said base component and to said first surface of said window frame component by a sealing glass having a coefficient of thermal expansion within about 20% of the coefficient of thermal expansion of said base component;
   a cover component adapted to be bonded to the second surface of said window frame component; and
   an anodization layer having a thickness in the range of from about 10 to about 2000 micro inches and covering at least those portions of said base and window frame components exposed to the atmosphere, as well as those portions bonded to said sealing glass.

2. The package of claim 1 wherein said sealing glass consists essentially of at least 40 molar percent $SiO_2$, from about 5 to about 25% BaO, from about 15 to about 45% of an alkaline oxide component comprising at least two oxides selected from the group consisting of $Li_2O$, $K_2O$, $Rb_2O_3$ and $Cs_2O_3$, from about 0.1 to 5% of a nucleating agent, up to about 15% ZnO, up to about 10% PbO, up to about 5% $Al_2O_3$ and up to about 10% of an additive.

3. The package of claim 1 wherein said glass has the composition by weight of 32–50% $SiO_2$, 4%–27% $Na_2O$, 4%–27% $K_2O$, up to 5% $Li_2O$, 2%–8% BaO, 2%–8% SrO, 4%–30% $TiO_2$, up to 7% ZnO, up to 2% $ZrO_2$ and up to 2% $Al_2O_3$.

4. A package of claim 3 wherein the $SiO_2$ concentration is less than about 45%.

5. The package of claim 1 wherein said cover component is formed from aluminum or an aluminum alloy having an anodization layer covering at least those portions exposed to the atmosphere.

6. The package of claim 5 wherein the thickness of said anodization layer is from about 1000 to about 2000 micro inches.

7. The package of claim 5 wherein substantially the entire surface of the base component and the cover component are covered with an anodization layer.

8. The package of claim 5 wherein substantially the entire surface of the base component and of the cover component, except for the surface of said base component to be bonded to said electronic device is covered with an anodization layer.

9. The package of claim 5 wherein substantially the entire surface of the base component and of the cover component except for the surface of said cover component enclosed within said cavity is covered with an anodization layer.

10. The package of claim 1 wherein said sealing glass has a coefficient of thermal expansion within about 10% of the coefficient of thermal expansion of said anodized aluminum based component.

11. The package of claim 10 wherein the composition of said sealing glass is about 40 molar percent $Na_2O$, 10% BaO, 1% $Al_2O_3$ and 49% $P_2O_5$.

12. The package of claim 1 wherein said sealing glass is a composite comprising a first component consisting essentially of a glass matrix selected from the group consisting lead borate, lead-zinc borate, lead-borate silicate and lead-zinc borate silicate glasses, said vitreous glass matrix having a coefficient of thermal expansion in excess of about $80 \times 10^{-7}$ in/in/°C. (from ambient to glass transition temperature) and a second component mixed into said first component to increase the effective coefficient of thermal expansion of the resulting glass composite to be close to that of said aluminum substrate, said second component consisting essentially of an effective amount up to about 30 weight percent of calcium fluoride and barium fluoride.

13. The package of claim 1 wherein said sealing glass is comprised of a homogenious mixture of Oxides consisting essentially of at least 50 molar percent $SiO_2$, from about 12 to 15% BaO, from about 20 to 30% of an alkaline oxide component comprised of at least two alkaline oxides selected from the group consisting of $Na_2O$, $K_2O$, and $Li_2O$, from about 0.5 to about 5% $Al_2O_3$ and up to about 10% of an additive selected from the group consisting of $B_2O_3$, $P_2O_5$, MgO, CaO, $GeO_2$, SrO, PbO and mixtures thereof.

* * * * *